US008564124B2

(12) United States Patent
Briere et al.

(10) Patent No.: US 8,564,124 B2
(45) Date of Patent: Oct. 22, 2013

(54) SEMICONDUCTOR PACKAGE

(75) Inventors: Michael A. Briere, Manhattan Beach, CA (US); Chuan Cheah, Redondo Beach, CA (US); Kunzhong Hu, Santa Monica, CA (US)

(73) Assignee: International Rectifier Corporation, El Segundo, CA (US)

(*) Notice: Subject to any disclaimer, the term of this patent is extended or adjusted under 35 U.S.C. 154(b) by 156 days.

(21) Appl. No.: 11/715,226

(22) Filed: Mar. 7, 2007

(65) Prior Publication Data

US 2007/0210438 A1 Sep. 13, 2007

Related U.S. Application Data

(60) Provisional application No. 60/779,763, filed on Mar. 7, 2006.

(51) Int. Cl.
*H01L 23/48* (2006.01)

(52) U.S. Cl.
USPC ...... 257/713; 257/666; 257/712; 257/E23.08; 257/E21.51; 438/108; 438/118; 438/123

(58) Field of Classification Search
USPC .............. 257/712, 713, 666, E23.08, E21.51; 438/118, 108, 123
See application file for complete search history.

(56) References Cited

U.S. PATENT DOCUMENTS

| 5,625,226 | A | 4/1997 | Kinzer | 257/705 |
|---|---|---|---|---|
| 6,211,567 | B1 | 4/2001 | Pelly | 257/707 |
| 2007/0025079 | A1* | 2/2007 | Salmon | 361/688 |
| 2007/0029683 | A1* | 2/2007 | Tsai et al. | 257/796 |
| 2007/0072339 | A1* | 3/2007 | Chen et al. | 438/106 |
| 2007/0200207 | A1* | 8/2007 | Ramos et al. | 257/666 |

OTHER PUBLICATIONS

"QFN." *Wikipedia, The Free Encyclopedia.* Feb. 20, 2009, 20:03 UTC. Apr. 22, 2009 <http://en.wikipedia.org/w/index.php?title=QFN&oldid=272127353>.

* cited by examiner

*Primary Examiner* — Cathy N Lam
(74) *Attorney, Agent, or Firm* — Farjami & Farjami LLP

(57) ABSTRACT

A semiconductor package that includes a semiconductor die and a heat spreader thermally coupled to the semiconductor and disposed at least partially within the molded housing of the package.

10 Claims, 2 Drawing Sheets

SEMICONDUCTOR PACKAGE

RELATED APPLICATION

This application is based on and claims priority to the of U.S. Provisional Application Ser. No. 60/779,763, filed on Mar. 7, 2006, entitled Thermal Improvement on QFN Package, to which a claim of priority is hereby made and the disclosure of which is incorporated by reference.

BACKGROUND OF THE INVENTION

The present invention relates to semiconductor device packages.

A well known package arrangement is a Quad Flatpak No Lead (QFN) package. A QFN is a semiconductor package that includes a plurality of pads disposed at the edges thereof, and in some variations a die pad. The pads and the die pad are exposed at the bottom of the package and adapted for surface mounting.

It is well known that a semiconductor die within a package, such as a QFN package, generates heat while operating. The heat so generated must be dissipated to avoid adverse effects on the operation of the die.

One known method for dissipating the generated heat is to thermally connect a heat sink or a heat spreader to the outside of the package. Such a method, however, increases the height of the package. In addition, in such an arrangement the thermal path between the die and the heat sink or heat spreader includes the full thickness of the housing of the package, which prevents the efficient transfer of heat from the die to the heat dissipating body.

SUMMARY OF THE INVENTION

In a semiconductor package according to the present invention, a metallic heat spreader is disposed within the housing of a package and is mechanically and thermally connected to the die directly. Thus, the increase in the height of the package is avoided.

A semiconductor package according to the present invention includes a plurality of leads, a semiconductor die including a plurality of I/O electrodes on a first surface thereof, a conductive interconnect body interposed between each I/O electrode and a respective lead, a metallic heat spreader thermally and mechanically coupled to a second surface of the semiconductor die opposite the first surface, a molded housing encapsulating the semiconductor die, and the conductive interconnect bodies, and at least part of the metallic head spreader.

According to one aspect of the present invention the metallic heat spreader is made from copper in order to absorb as much heat from the die as possible.

According to another aspect of the present invention solder or an electrically conductive polymer is used to couple the heat spreader to the inactive second surface of the semiconductor die in order to efficiently transfer heat from the die to the heat spreader.

Other features and advantages of the present invention will become apparent from the following description of the invention which refers to the accompanying drawings.

BRIEF DESCRIPTION OF THE DRAWING(S)

DETAILED DESCRIPTION OF THE FIGURES

Figure 1:
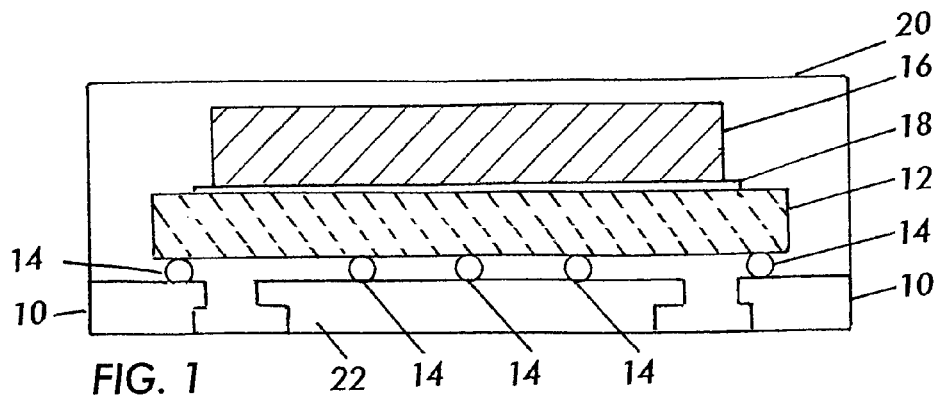
FIG. 1 shows a cross-sectional view of a package according to the first embodiment of the present invention.

Referring to FIG. 1, a semiconductor package according to the first embodiment of the present invention includes a lead frame that includes a plurality of leads 10, a semiconductor die 12 that includes a plurality of input/output (I/O) electrodes (not shown specifically) on a first surface thereof, a conductive interconnect 14 interposed between each I/O electrode and a respective lead 10, a metallic heat spreader 16 thermally coupled to a second surface (opposite the first surface) of semiconductor die 12 with a thermally conductive adhesive body 18, and a molded housing 20 formed with mold compound molded over to encapsulate at least die 12, conductive interconnects 14, and at least portions of leads 10. Note that in the first embodiment, metallic heat spreader 16 is fully molded over by and thus encapsulated by molded housing 20. Furthermore, a package according to the first embodiment includes a die pad 22. Interconnects 14 are disposed between die pad 22 and first surface of die 12 whereby die 12 is further supported by die pad 22.

Preferably, interconnects 14 are solder bumps, but may be copper bumps, gold bumps, or pillar bumps. Further, preferably leads 10 are part of a QFN lead frame. Thus, a package according to the present invention preferably conforms to QFN standard. Moreover, because the second surface of die 12 is electrically inactive, solder or a conductive epoxy may be used (both efficient heat conductors) to couple heat spreader 16 to the second surface of die 12. It should be noted that a thermally conductive, but electrically non-conductive adhesive such as a thermal epoxy may be used as an adhesive body 18 without deviating from the present invention.

According to one aspect of the present invention, spreader 16 is formed with copper. Thus, in the first embodiment (FIG. 1) a copper block or slug is used as a heat spreader 16.

Figure 2:
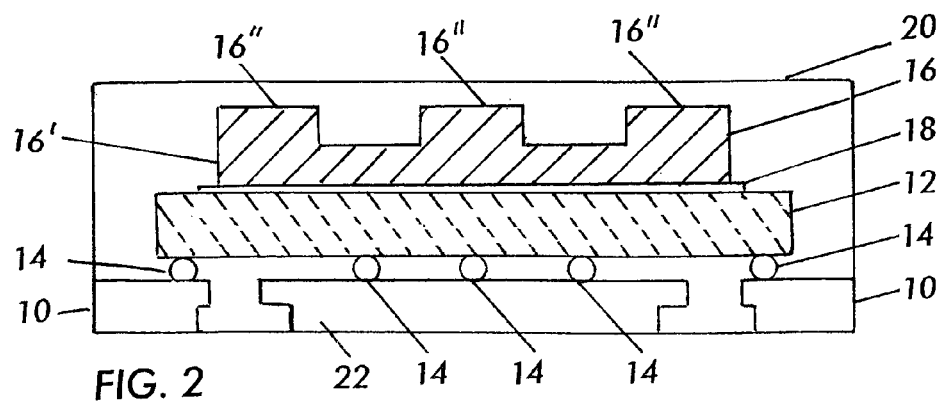
FIG. 2 shows a cross-sectional view of a package according to the second embodiment of the present invention.

Referring now to FIG. 2, in which like numerals identify like features, in a package according to the second embodiment of the present invention, heat spreader 16, which may be formed with copper, includes a copper slug body 16' and a plurality of fins 16".

Figure 3:
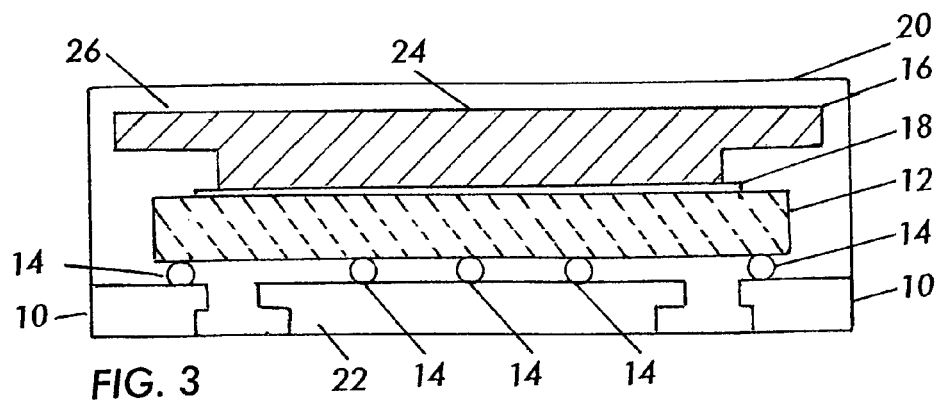
FIG. 3 shows a cross-sectional view of a package according to the third embodiment of the present invention.

Referring to FIG. 3, in which like numerals identify like features, in a package according to the third embodiment heat spreader 16, which may be formed with copper, includes a first face 24 having a first lateral dimension and a second face 26 (opposite the first face 24) having a second lateral dimension that is wider than the first lateral dimension. In the third embodiment, first face 24 is coupled to the second surface of die 12.

Figure 4:
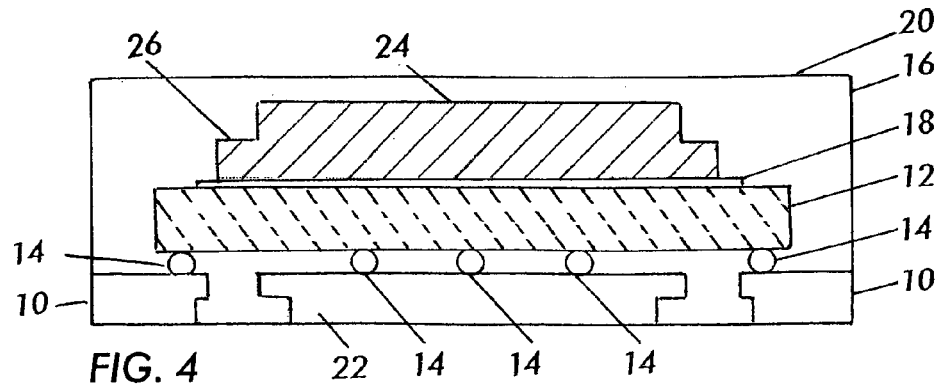
FIG. 4 shows a cross-sectional view of a package according to the fourth embodiment of the present invention.

In the fourth embodiment, as depicted by FIG. 4, second face 26 of heat spreader 16 is coupled to the second surface of die 12. Note that in a package according to the fourth embodiment first face 24 of heat spreader 16 is exposed through molded housing 20. To obtain an exposed first face 24 soft top molding may be employed. Alternatively, heat spreader 16 may be molded over with mold compound, and then exposed by grinding away the mold compound residing atop heat spreader 16.

Figure 5:
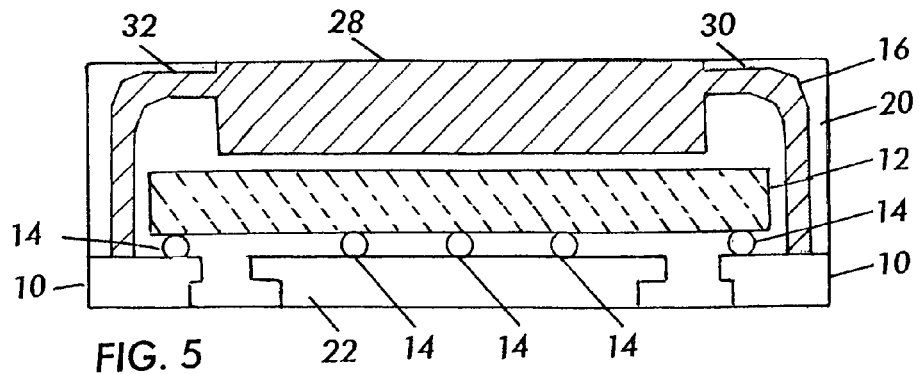
FIG. 5 shows a cross-sectional view of a package according to the fifth embodiment of the present invention.

Referring now to FIG. 5, in which like numerals identify like features, a package according to the fifth embodiment of the present invention includes a compressible (i.e. compliant) copper heat spreader, which includes a copper slug body 28 having at least a first leg 30, and a second leg 32 each extending from a respective side of slug body 28. Each leg 30, 32 extends laterally outside the outer boundary of die 12 and includes an end that is disposed on a respective lead 10, whereby heat spreader 16 is disposed over die 12 like a tent. Note that in a package according to the fifth embodiment instead of an adhesive, copper slug 28 may be coupled to die 12 through an interposing body of mold compound residing between slug 28 and the second surface of die 12.

Figure 6:
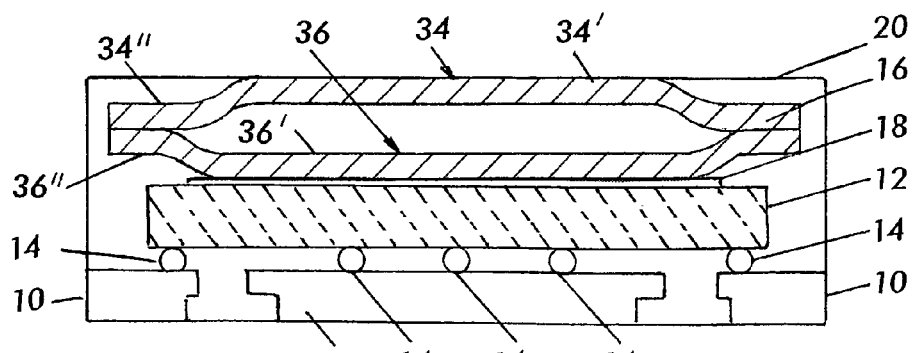
FIG. 6 shows a cross-sectional view of a package according to the sixth embodiment of the present invention.

Referring now to FIG. 6, in which like numerals identify like features, in a package according to the sixth embodiment, heat spreader 16 may be comprised of two saucer-shaped copper bodies 34, 36 each including a cup portion 34', 36' and a flange portion 34", 36" disposed at the opening of the cup portion 34', 36' thereof. Note that in the sixth embodiment the interiors of the cup portion 34', 36' of saucer-shaped copper bodies 34, 36 face one another, and flange portions 34", 36" thereof are in contact with one another, whereby the arrangement is rendered compressible or compliant (as opposed to rigid).

Figure 7:
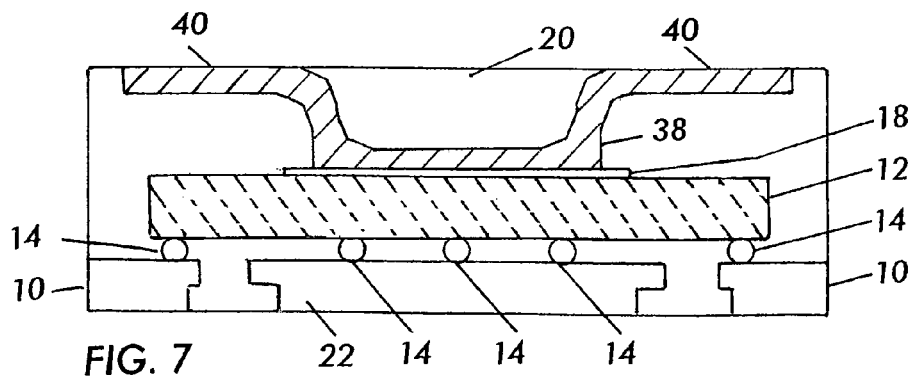
FIG. 7 shows a cross-sectional view of a package according to the seventh embodiment of the present invention.

Referring next to FIG. 7, in which like numerals identify like features, in a package according to the seventh embodiment, heat spreader 16 is a compressible saucer-shaped copper body which includes a cup portion 38, and a flange portion 40 at the opening of cup portion 38 thereof. Note that flange portion 40 is exposed through molded housing 20.

Figure 8:
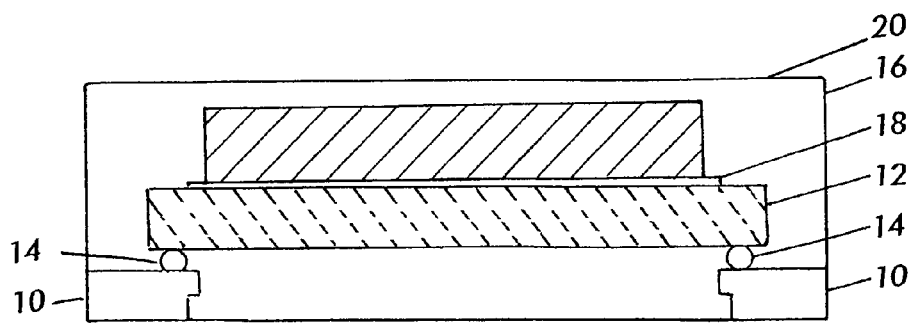
FIG. 8 shows a cross-sectional view of a package according to the eighth embodiment of the present invention.

Referring now to FIG. 8, in which like numerals identify like features, in a package according to the eighth embodiment of the present invention, die pad 22 may be omitted, while other features of the invention may be retained. Thus, for example, as shown, a package according to the first embodiment may have die pad 22 thereof omitted to obtain a package according to the eighth embodiment.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package, comprising:
a plurality of leads;
a semiconductor die including a first surface;
a first conductive interconnect body interposed between said first surface of said semiconductor die and a respective lead;
a metallic heat spreader including a first face having a first lateral dimension and a second opposing face having a second lateral dimension wider than said first lateral dimension, said first face thermally and mechanically coupled using a layer of thermally and electrically conductive adhesive to a second surface of said semiconductor die opposite said first surface, wherein said second surface is electrically inactive and has a third lateral dimension wider than said first lateral dimension, and wherein said first face substantially covers an entirety of said second surface;
a die pad;
a molded housing encapsulating said semiconductor die, a portion of said die pad, each said first conductive interconnect body, and at least part of said metallic heat spreader; and
a second interconnect body interposed between said first surface of said semiconductor die and said die pad, wherein said die pad is disposed between and lateral to said plurality of leads.

2. The semiconductor package of claim 1, wherein said first and second conductive interconnect bodies are solder bumps.

3. The semiconductor package of claim 1, wherein said first and second conductive interconnect bodies are copper bumps.

4. The semiconductor package of claim 1, wherein said first and second conductive interconnect bodies are gold bumps.

5. The semiconductor package of claim 1, wherein said first and second conductive interconnect bodies are pillar bumps.

6. The semiconductor package of claim 1, wherein said semiconductor package is a QFN package.

7. The semiconductor package of claim 1, wherein said thermally and electrically conductive adhesive is an epoxy.

8. The semiconductor package of claim 1, wherein said thermally and electrically conductive adhesive is a solder.

9. The semiconductor package of claim 1, wherein said metallic heat spreader is comprised of a copper slug.

10. The semiconductor package of claim 9, wherein said copper slug is encapsulated by said molded housing.

* * * * *